United States Patent
Yun

(10) Patent No.: US 9,857,406 B2
(45) Date of Patent: Jan. 2, 2018

(54) THREE-PHASE WIRING DETECTION DEVICE AND COINCIDENCE PHASE DETECTION METHOD

(71) Applicant: LSIS CO., LTD., Anyang-si, Gyeonggi-do (KR)

(72) Inventor: Jae Jun Yun, Cheongju-si (KR)

(73) Assignee: LSIS CO., LTD., Anyang-si (KR)

( * ) Notice: Subject to any disclaimer, the term of this patent is extended or adjusted under 35 U.S.C. 154(b) by 317 days.

(21) Appl. No.: 14/570,841

(22) Filed: Dec. 15, 2014

(65) Prior Publication Data
US 2015/0212130 A1    Jul. 30, 2015

(30) Foreign Application Priority Data
Jan. 28, 2014  (KR) .......................... 10-2014-0010770

(51) Int. Cl.
   *G01R 29/16*    (2006.01)
   *G01R 31/08*    (2006.01)

(52) U.S. Cl.
   CPC .................... *G01R 29/16* (2013.01)

(58) Field of Classification Search
   CPC ........................................ G01R 29/16
   See application file for complete search history.

(56) References Cited

U.S. PATENT DOCUMENTS

| | | | | |
|---|---|---|---|---|
| 5,488,281 | A | * | 1/1996 | Unsworth .............. H02P 27/02 318/798 |
| 2008/0167826 | A1 | * | 7/2008 | Murry ................... G01R 31/041 702/58 |
| 2010/0102771 | A1 | * | 4/2010 | Anderson ................ H02P 23/14 318/809 |

FOREIGN PATENT DOCUMENTS

| KR | 1993-0004574 | 6/1993 |
|---|---|---|
| KR | 20-0410792 | 3/2006 |

OTHER PUBLICATIONS

Korean Intellectual Property Office Application Serial No. 10-2014-0010770, Office Action dated Dec. 17, 2014, 4 pages.

* cited by examiner

*Primary Examiner* — Arleen M Vazquez
*Assistant Examiner* — Feba Pothen
(74) *Attorney, Agent, or Firm* — Lee, Hong, Degerman, Kang & Waimey

(57) ABSTRACT

Disclosed are a three-phase wiring detection device and a coincidence phase detection method. The three-phase wiring detection device and the coincidence phase detection method compare a power factor relationship between a three-phase voltage and a three-phase current, and determines whether a coincidence phase is coincident between the three-phase voltage and the three-phase current, thereby checking whether the coincidence phase is accurately coincident. Therefore, whether the coincidence phase is coincident between the three-phase voltage and the three-phase current can be checked, and a function of a reverse phase detector and a function of a coincidence phase checker can be implemented. Also, the three-phase voltage and the three-phase current can be accurately detected.

5 Claims, 4 Drawing Sheets

THREE-PHASE WIRING DETECTION DEVICE AND COINCIDENCE PHASE DETECTION METHOD

CROSS-REFERENCE TO RELATED APPLICATION

Pursuant to 35 U.S.C. §119(a), this application claims the benefit of earlier filing date and right of priority to Korean Application No. 10-2014-0010770, filed on Jan. 28, 2014, the contents of which are incorporated by reference herein in its entirety.

BACKGROUND OF THE DISCLOSURE

1. Field of the Disclosure

The present disclosure relates to a three-phase wiring detection device and a coincidence phase detection method, and particularly, to a three-phase wiring detection device and a coincidence phase detection method, which can obtain accurate phase accordance information by comparing power factors.

2. Background of the Disclosure

FIG. 1 is a diagram illustrating a configuration of a related art AD converter for detecting a phase sequence.

In the related art, as illustrated in FIG. 1, an input is input to a three-phase system 1 which operates with a three-phase current or voltage, and data is obtained through an AD converter 3. In this case, when the input of the three-phase system 3 is high in level, a level of the input is converted into a level suitable for the AD converter 3 by using a current transformer (CT) or a potential transformer (PT) 2, thereby obtaining the data. The obtained data is analyzed by a reverse phase detection algorithm. Therefore, whether a phase sequence of a current or a voltage is a normal phase or a reverse phase may be determined.

In the related art, data is obtained from an input of the three-phase system, and whether a phase is a reverse phase or a normal phase is determined by using the reverse phase detection algorithm. However, such a method determines a reverse phase or a normal phase, but cannot accurately arrange a phase sequence. For example, a phase sequence of RST, TRS, and STR is not a reverse phase, and thus is determined as a normal phase. Even when a current and a voltage are determined as having a normal phase, a problem occurs in which phase sequences are not coincident.

SUMMARY OF THE DISCLOSURE

Therefore, an aspect of the detailed description is to provide a three-phase wiring detection device and a coincidence phase detection method, which compare a power factor of a three-phase voltage and a power factor of a three-phase current to determine whether a coincidence phase of the three-phase voltage is coincident with a coincidence phase of the three-phase current, thereby checking whether the coincidence phases are accurately coincident.

To achieve these and other advantages and in accordance with the purpose of this specification, as embodied and broadly described herein, a three-phase wiring detection device includes: a connection unit connected to an input terminal of a load receiving power from a system that supplies three-phase power; and a detection unit configured to detect a three-phase voltage of the system and a three-phase input current of the load, compare a power factor relationship with phases of the three-phase input current, based on one phase of the three-phase voltage, and detect a wiring state of the input terminal, based on a result of the comparison.

In an embodiment, the detection unit may determine that among the phases of the three-phase input current, a phase in which a power factor is the highest is a phase coincident with a reference phase, based on the result of the comparison.

In an embodiment, the detection unit may determine a phase sequence of each of the three-phase voltage and the three-phase input current by using one of a zero cross detection technique and a symmetric coordinate technique.

In an embodiment, when a phase sequence of the three-phase input current is a negative sequence, the detection unit may rearrange the phase sequence of the three-phase input current so that the phase sequence of the three-phase input current becomes a positive sequence, and detects a wiring state of the input terminal.

In an embodiment, the connection unit may include a potential transformer (PT) 30 and a current transformer (CT), and the detection unit may detect the three-phase voltage and the three-phase input current through the PT and the CT.

In an embodiment, the three-phase wiring detection device may further include a display unit configured to display a detection result of the detection unit, wherein the detection result may include at least one selected from a detection value of the three-phase voltage, a detection value of the three-phase input current, and a wiring state of the input terminal.

In another aspect of the present invention, a coincidence phase detection method includes: detecting a three-phase voltage of a system and a three-phase input current of an input terminal of a load which is supplied with power from the system; comparing a power factor relationship with phases of the three-phase input current, based on one phase of the three-phase voltage; and determining that among phases of the three-phase input current, a phase in which power factor is the highest is a phase coincident with a reference phase, based on a result of the comparison.

In an embodiment, the detecting may include determining a phase sequence of each of the three-phase voltage and the three-phase input current. In this case, the phase sequence of each of the three-phase voltage and the three-phase input current may be determined by using one of a zero cross detection technique and a symmetric coordinate technique.

In an embodiment, the determining of the phase sequence of each of the three-phase voltage and the three-phase input current may include, when a phase sequence of the three-phase input current is a negative sequence, rearranging the phase sequence of the three-phase input current so that the phase sequence of the three-phase input current becomes a positive sequence.

In an embodiment, the detecting may include detecting the three-phase voltage and the three-phase input current through a potential transformer (PT) and a current transformer (CT)

In an embodiment, the comparing and the determining may be repeated on phases, instead of a reference phase, among the phases of the three-phase voltage.

In an embodiment, the coincidence phase detection method may further include displaying a detection result and a determination result in a display unit that displays the detection result of the detecting and the determination result of the determining.

The three-phase wiring detection device and the coincidence phase detection method disclosed in the present specification enable a user to check whether a coincidence phase is accurately coincident between a three-phase voltage and a three-phase current.

The three-phase wiring detection device and the coincidence phase detection method disclosed in the present specification enable a user to check whether a coincidence phase is accurately coincident between a three-phase voltage and a three-phase current, without adding a separate device. Accordingly, a function of a reverse phase detector and a function of a coincidence phase checker can be implemented.

The three-phase wiring detection device and the coincidence phase detection method disclosed in the present specification enable a user to check whether a coincidence phase is accurately coincident between a three-phase voltage and a three-phase current, and thus, the three-phase voltage and the three-phase current can be accurately detected.

The three-phase wiring detection device and the coincidence phase detection method disclosed in the present specification enable a user to check whether a coincidence phase is accurately coincident between a three-phase voltage and a three-phase current, and thus, a separate process of checking whether the coincidence phase is accurately coincident between the three-phase voltage and the three-phase current is omitted. Accordingly, a time which is expended in installation and wiring of a three-phase apparatus and system can be saved.

The three-phase wiring detection device and the coincidence phase detection method disclosed in the present specification enable a user to check whether a coincidence phase is accurately coincident between a three-phase voltage and a three-phase current, and thus can prevent a defective wiring of a three-phase apparatus and system.

The three-phase wiring detection device and the coincidence phase detection method disclosed in the present specification enable a user to check whether a coincidence phase is accurately coincident between a three-phase voltage and a three-phase current, and thus, an accurate wiring of a three-phase apparatus and system can be made.

The three-phase wiring detection device and the coincidence phase detection method disclosed in the present specification enable a user to check whether a coincidence phase is accurately coincident between a three-phase voltage and a three-phase current, and thus, a three-phase apparatus and system can accurately detect data, and can be accurately, stably controlled.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Figure 1:
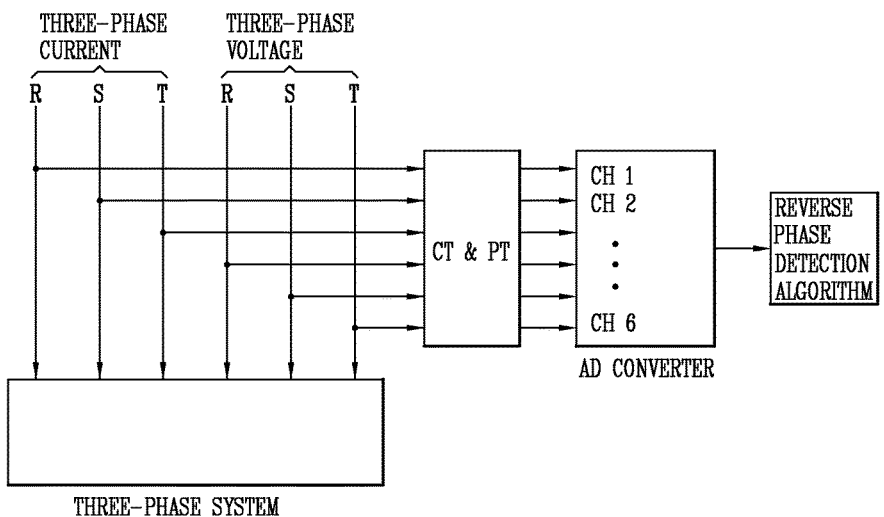
FIG. 1 is a diagram illustrating a configuration of a related art AD converter for detecting a phase sequence.

Description will now be given in detail of the exemplary embodiments, with reference to the accompanying drawings. For the sake of brief description with reference to the drawings, the same or equivalent components will be provided with the same reference numbers, and description thereof will not be repeated.

Technology disclosed in the present invention may be applied to a three-phase wiring detection device and a coincidence phase detection method. However, the technology disclosed in the present specification is not limited thereto, and may be applied to a data detection device and a control device of all three-phase apparatuses and systems to which the technical spirit of the technology is applied, and for example, to a three-phase watt-hour meter and a three-phase power line communication device. In particular, the technology disclosed in the present specification may be applied to an inverter and a controller which control a three-phase motor.

The terminology used herein is for the purpose of describing particular embodiments only and is not intended to be limiting of the invention. Unless otherwise defined, all terms used herein have the same meaning as commonly understood by one of ordinary skill in the art to which this invention pertains, and should not be interpreted as having an excessively comprehensive meaning nor as having an excessively contracted meaning. If technical terms used herein is erroneous that fails to accurately express the technical idea of the present invention, it should be replaced with technical terms that allow the person in the art to properly understand. The general terms used herein should be interpreted according to the definitions in the dictionary or in the context and should not be interpreted as an excessively contracted meaning.

As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, steps, operations, elements, components, and/or groups thereof.

The exemplary embodiments of the present invention will now be described with reference to the accompanying drawings, in which like numbers refer to like elements throughout.

In describing the present invention, if a detailed explanation for a related known function or construction is considered to unnecessarily divert the gist of the present invention, such explanation has been omitted but would be understood by those skilled in the art. The accompanying drawings of the present invention aim to facilitate understanding of the present invention and should not be construed as limited to the accompanying drawings.

Hereinafter, a three-phase wiring detection device and a coincidence phase detection method disclosed in the present specification will be described in detail. However, for convenience of description and to aid in understanding an embodiment, items of a description are divided into a three-phase wiring detection device, a coincidence phase detection method, a detailed embodiment, and an additional embodiment, and the three-phase wiring detection device and the coincidence phase detection method disclosed in the present specification will be described in the order of the items.

[Three-Phase Wiring Detection Device]

A three-phase wiring detection device disclosed in the present specification may be implemented by an embodiment of a coincidence phase detection method and some or a combination of elements or stages included in below-described embodiments, or may be implemented by a combination of embodiments. Technical terms used herein are used for merely describing a specific embodiment, and do not limit the spirit of technology disclosed in the present specification.

Hereinafter, a three-phase wiring detection device (hereinafter referred to as a detection device) disclosed in the present specification will be described in detail with reference to FIGS. 2 and 3.

Figure 2:
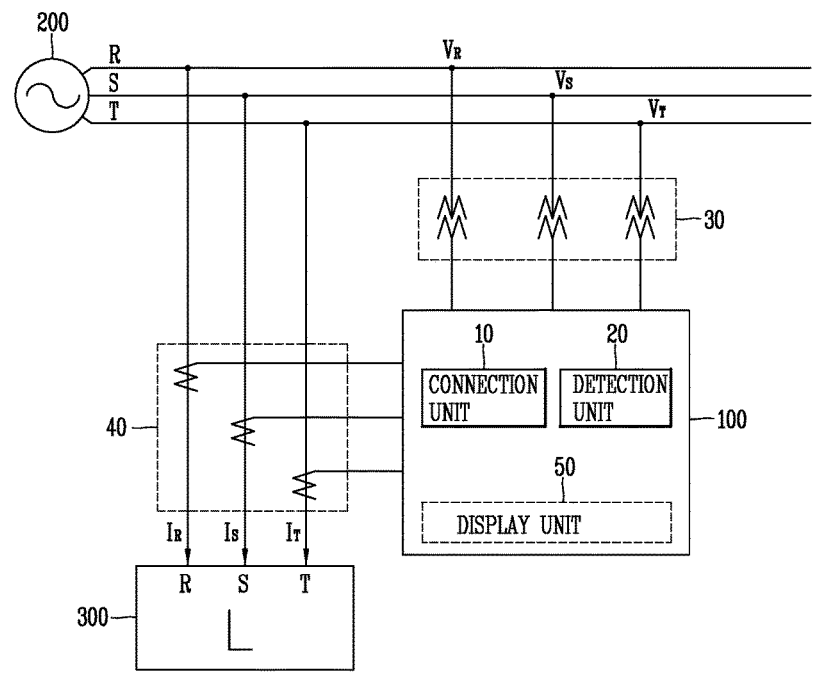
FIG. 2 is a diagram illustrating a configuration of a three-phase wiring detection device disclosed in the present specification.

FIG. 2 is a diagram illustrating a configuration of a three-phase wiring detection device disclosed in the present specification.

Figure 3A:
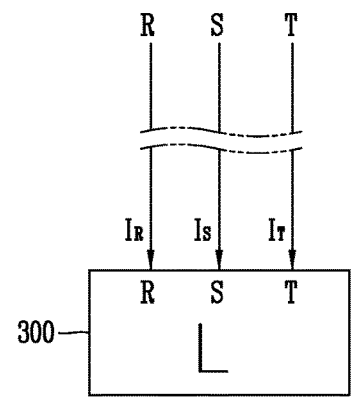
FIG. 3A is an exemplary diagram 1 illustrating an example of a wiring to which the three-phase wiring detection device disclosed in the present specification is applied.

FIG. 3A is an exemplary diagram 1 illustrating an example of a wiring to which the three-phase wiring detection device disclosed in the present specification is applied.

Figure 3B:
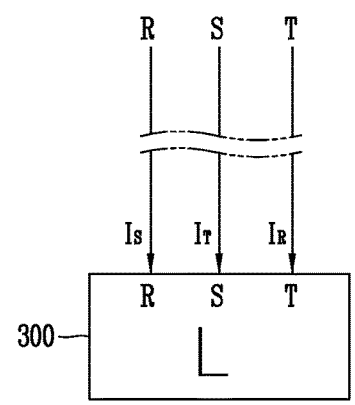
FIG. 3B is an exemplary diagram 2 illustrating an example of a wiring to which the three-phase wiring detection device disclosed in the present specification is applied.

FIG. 3B is an exemplary diagram 2 illustrating an example of a wiring to which the three-phase wiring detection device disclosed in the present specification is applied.

Figure 3C:
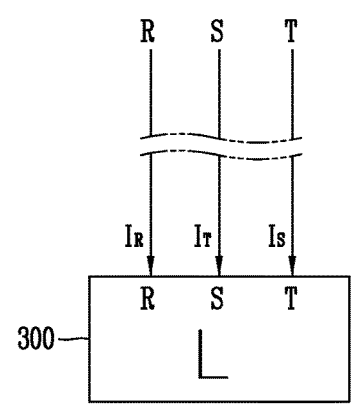
FIG. 3C is an exemplary diagram 3 illustrating an example of a wiring to which the three-phase wiring detection device disclosed in the present specification is applied.

FIG. 3C is an exemplary diagram 3 illustrating an example of a wiring to which the three-phase wiring detection device disclosed in the present specification is applied.

As illustrated in FIG. 2, a detection device 100 includes a connection unit 10, which is connected to an input terminal of a load 300 receiving power from a system 200 that supplies three-phase power, and a detection unit 20 that detects a three-phase voltage of the system 200 and a three-phase input current of the load 300, compares a power factor relationship with phases of the three-phase input current, based on one phase of the three-phase voltage, and detects a wiring state of the input terminal, based on a result of the comparison.

The system 200 is a system that receives and supplies power, and may denote a three-phase system in which a plurality of electricity generation sources, a plurality of substations, a distribution line, and a load are provided as one body, and power generation, power distribution, and consumption are performed.

In the system 200, three phases may be divided into an R phase, an S phase, and a T phase.

The R phase, the S phase, and the T phase may have a phase difference of 120 degrees therebetween.

For example, with respect to the R phase of 0 degrees, the S phase may have a phase difference of 120 degrees with the R phase, and the T phase may have a phase difference of 120 degrees with the S phase and have a phase difference of 240 degrees with the R phase.

In the R phase, the S phase, and the T phase, a phase sequence may be provided in the above-described order.

That is, the R phase may be a first phase, the S phase may be a second phase, and the T phase may be a third phase. Therefore, a phase sequence may be provided in the order of R-S-T.

That is, in the system 200, a phase sequence may be provided in the order of R-S-T.

The system 200 may supply three-phase power, which is generated by the plurality of electricity generation sources, to the load 300.

The load 300 may be a three-phase apparatus or system which consumes the three-phase power supplied from the system 200.

For example, the load 300 may be a building, a factory, or a large plant, or may be an industrial device or large-scale load equipment, which is driven with the three-phase power, such as a three-phase motor or an inverter.

The load 300 may be supplied with the three-phase power through the input terminal which is divided into the R phase, the S phase, and the T phase.

That is, as illustrated in FIG. 3A, the R phase of the input terminal may be connected to the R phase of the system 200, the S phase of the input terminal may be connected to the S phase of the system 200, and the T phase of the input terminal may be connected to the T phase of the system 200. Therefore, the input terminal may be supplied with the power.

As illustrated in FIG. 3A, a state in which the input terminal of the load 300 is connected to the system 200 in the order of R-S-T may be a state in which a wiring is made in a positive sequence.

When the three-phase power is not supplied to the input terminal which is divided into the R phase, the S phase, and the T phase, the load 300 may not normally operate.

For example, such a case may be a case, in which the input terminal is connected to the system 200 in a negative sequence, or a case in which the input terminal is connected to the system 200 under a phase discordance condition.

As illustrated in FIG. 3B, the R phase of the input terminal may be connected to the R phase of the system 200, the S phase of the input terminal may be connected to the T phase of the system 200, and the T phase of the input terminal may be connected to the S phase of the system 200. Therefore, a state in which the input terminal is connected to the system 200 in the order of R-T-S may be a state in which a wiring is made in a negative sequence.

A case, in which the input terminal is connected to the system 200 in a negative sequence, may be a case in which the input terminal is connected to the system 200 in the order of R-T-S, the order of T-S-R, and the order of S-R-T where a phase sequence in the order of R-S-T is changed.

That is, a negative sequence may be provided by switching between the orders of two phases in the order of R-S-T.

When the input terminal is connected to the system 200 in a negative sequence, the load 300 may perform a reverse operation.

For example, when the load 300 is the three-phase motor, the R phase of the input terminal may be connected to the T phase of the system 200, the S phase of the input terminal may be connected to the S phase of the system 200, and the T phase of the input terminal may be connected to the R phase of the system 200. That is, when the input terminal is connected to the system 200 in the order of T-S-R which corresponds to a negative sequence with respect to the order of R-S-T, the three-phase motor may reversely rotate according to the order of T-S-R which corresponds to a negative sequence.

Alternatively, the R phase of the input terminal may be connected to the R phase of the system 200, the S phase of the input terminal may be connected to the T phase of the system 200, and the T phase of the input terminal may be connected to the S phase of the system 200. That is, even when the input terminal is connected to the system 200 in the order of R-T-S which corresponds to a negative sequence with respect to the order of R-S-T, the three-phase motor may reversely rotate according to the order of R-S-T which corresponds to a negative sequence.

A case, in which the input terminal is connected to the system 200 under a phase discordance condition, is a case in which each phase of the input terminal does not match each phase of the system 200, and may include a case, in which the input terminal is connected to the system 200 in a negative sequence, and a case in which the R phase of the input terminal is connected to one of the S phase and T phase of the system 200, the S phase of the input terminal is connected to one of the R phase and T phase of the system 200, and the T phase of the input terminal is connected to one of the R phase and S phase of the system 200.

For example, the case may include the order of T-S-R, the order of R-T-S, and the order of S-R-T, which corresponds to a case in which the input terminal is connected to the system 200 in a negative sequence. Also, the case may further include a case in which the input terminal is connected to the system 200 in the order of S-T-R or the order of T-R-S.

As illustrated in FIG. 3C, the R phase of the input terminal may be connected to the S phase of the system 200, the S phase of the input terminal may be connected to the T phase of the system 200, and the T phase of the input terminal may be connected to the R phase of the system 200. Therefore, a state in which the input terminal is connected to the system 200 in the order of S-T-R may be a state in which a wiring is made under a phase discordance condition.

When the input terminal is connected to the system 200 under the phase discordance condition, a rated voltage and a rated current may not be supplied to the load 300, or it is difficult to detect the three-phase voltage and the three-phase input current.

That is, the input terminal of the load 300 may be connected to the system 200 so as to match the order of R-S-T corresponding to a phase sequence of the system 200.

The connection unit 10 included in the three-phase wiring detection device 100 may be connected to the system 200 and the input terminal of the load 300.

That is, the three-phase wiring detection device 100 may detect the three-phase voltage of the system 200 and the three-phase input current of the load 300 through the connection unit 10 which is connected to the system 200 and the input terminal of the load 300.

The detection unit 20 included in the three-phase wiring detection device 100 may detect the three-phase voltage and the three-phase input current through the connection unit 10.

That is, since the three-phase wiring detection device 100 detects the three-phase voltage and the three-phase input current through the connection unit 10 which is connected to the system 200 and the input terminal of the load 300, the three-phase wiring detection device 100 may detect a three-phase wiring state between the system 200 and the load 300.

The three-phase voltage may be a detection value which is obtained by detecting a voltage of the system 200.

The three-phase voltage may be a detection value for each of the R phase, S phase, and T phase of the system 200.

The three-phase voltage may be a voltage value of each of the R phase, S phase, and T phase of the system 200, and may be a detection value for each phase.

For example, when a voltage supplied from the system 200 is 200 V, a detection value for the R phase of the system 200 may be <200 V, 0 degrees>, a detection value for the S phase of the system 200 may be <200 V, 120 degrees>, and a detection value for the T phase of the system 200 may be <200 V, 240 degrees>.

The three-phase input current may be a detection value which is obtained by detecting a current which is input from the system 200 to the input terminal of the load 300.

The three-phase input current may be a detection value for each of the R phase, S phase, and T phase of the input terminal.

The three-phase input current may be a current value of each of the R phase, S phase, and T phase of the input terminal, and may be a detection value for each phase.

For example, when a current input to the input terminal of the load 300 is 20 A and the input terminal is connected to the system 200 in the order of R-S-T, a detection value for the R phase of the input terminal may be <20 A, 0 degrees>, a detection value for the S phase of the input terminal may be <20 A, 120 degrees>, and a detection value for the T phase of the input terminal may be <20 A, 240 degrees>.

The detection unit 20 may calculate a power factor relationship with the phases of the three-phase input current, based on one phase of the three-phase voltage.

For example, a power factor relationship with the R phase, S phase, and T phase of the input terminal may be compared based on the R phase of the system 200. When the input terminal is connected to the system 200 in the order of R-S-T, a power factor between the R phase of the system 200 and the R phase of the input terminal may be 100%, a power factor between the R phase of the system 200 and the S phase of the input terminal may be 50%, and a power factor between the R phase of the system 200 and the T phase of the input terminal may be 50%.

The detection unit 20 may compare a power factor relationship with the phases of the three-phase input current on the basis of one phase of the three-phase voltage, and detect a wiring state of the input terminal on the basis of a result of the comparison.

For example, the detection unit 20 may compare levels of power factors of the phases of the three-phase input current calculated based on one phase of the three-phase voltage, and detect a wiring state of the input terminal on the basis of a result of the comparison.

As the result of the comparison, the detection unit 20 may determine that among the phases of the three-phase input current, a phase in which a power factor is the highest is a phase coincident with a reference phase.

Since the phases of the system 200 and the phases of the input terminal have a phase difference of 120 degrees therebetween, the detection unit 20 may determine that phases, in which a phase difference between one phase of the system 200 and one phase of the input terminal is the minimum, are the same. Also, a power factor between phases in which a phase difference is the minimum may be calculated as a highest value.

That is, the detection unit 20 may calculate and compare power factors with the phases of the input terminal on the basis of one phase of the system 200, and determine that a phase of the input terminal, in which a power factor with a reference phase is the highest, is a phase coincident with the reference phase.

For example, as a result in which power factor levels with the phases of the three-phase input current are compared based on the R phase of the system 200, when a power factor with the R phase of the input terminal is 100%, a power factor with the S phase of the input terminal is 50%, and a power factor with the T phase of the input terminal is 50%, it may be determined that the R phase of the system 200, which is a reference phase, is a phase coincident with the R phase of the input terminal.

On the other hand, as a result in which power factor levels with the phases of the three-phase input current are compared based on the R phase of the system 200, when a power factor with the R phase of the input terminal is 50%, a power factor with the S phase of the input terminal is 100%, and a power factor with the T phase of the input terminal is 50%, it may be determined that the R phase of the system 200, which is a reference phase, differs from the R phase of the input terminal, and it may be determined that the S phase of the input terminal, in which a power factor is the highest, is a phase coincident with the reference phase.

The detection unit 20 may determine a phase sequence of each of the three-phase voltage and the three-phase input current by using one of a zero cross detection technique and a symmetric coordinate technique.

The detection unit 20 may apply the zero cross detection technique to the three-phase voltage and the three-phase input to determine the phase sequence of each of the three-phase voltage and the three-phase input.

As an example of determining a phase sequence by using the zero cross detection technique, when the input terminal is connected to the system 200 in the order of R-S-T, the phases of the system 200 may have a phase difference of 120 degrees therebetween. Therefore, a level of a voltage may be 0 at a 0-degree in the R phase of the system 200, a level of a voltage may be 0 at a 120-degree phase in the S phase of the system 200, and a level of a voltage may be 0 at a 240-degree in the T phase of the system 200. Accordingly, when the order in which a level of a voltage is 0 in each of the phases of the system 200 is detected, a phase sequence of the three-phase voltage may be determined, and since the phases of the input terminal have a phase difference of 120 degrees therebetween, when the order in which a level of a current is 0 in each of the phases of the input terminal is detected, a phase sequence of the three-phase input current may be determined.

For example, when the input terminal is connected to the system 200 in the order of R-T-S, a level of a current may be 0 at a 0-degree phase in the R phase of the input terminal. Since the S phase of the input terminal is connected to the T phase of the system 200, a level of a current may be 0 at a 240-degree phase in the S phase of the input terminal, and since the T phase of the input terminal is connected to the S phase of the system 200, a level of a current may be 0 at a 120-degree phase in the T phase of the input terminal. Therefore, the order in which a level of a current is 0 in each of the phases of the input terminal may be detected in the order of R-T-S, and thus, it may be determined that a phase sequence of the input terminal is connected in a negative sequence.

Moreover, the detection unit 20 may apply the symmetric coordinate technique to the three-phase voltage and the three-phase input current to determine a phase sequence of each of the three-phase voltage and the three-phase input current.

The symmetric coordinate technique may denote a method that calculates a voltage and a current of an electric circuit in consideration of that a voltage or a current is a sum of symmetric components in a multi-phase circuit which is asymmetric and disequilibrium.

The symmetric coordinate technique may denote a technique that converts a detection value of a voltage and a detection value of a current for each phase into symmetric coordinates of a zero phase component, a normal phase component, and a reverse phase component, and determines whether a phase sequence is a negative sequence, based on a size of the reverse phase component.

Moreover, the detection unit 20 may compare a size of one phase with a size of another phase at a time when size values of two phases meet each other, and determine a phase sequence of each of the three-phase voltage and the three-phase input current.

For example, when a size of the T phase of the input terminal is greater than that of the S phase of the input terminal at an intersection time (i.e., a time when R>S is changed to R<S) when a size of the R phase of the input terminal is greater than that of the S phase of the input terminal and then becomes less than that of the S phase of the input terminal, it may be determined that a wiring state of the input terminal is a state of being connected to the system 200 in a negative sequence.

Alternatively, in a case where the size of the R phase of the input terminal is greater than that of the T phase of the input terminal at a time when S>T is changed to S<T, when the size of the S phase of the input terminal is greater than that of the R phase of the input terminal at a time when T>R is changed to T<R, it may be determined that a wiring state of the input terminal is a state of being connected to the system 200 in a negative sequence.

When a phase sequence of the three-phase input current is a negative sequence, the detection unit 20 may rearrange the phase sequence of the three-phase input current so that the phase sequence of the three-phase input current becomes a positive sequence, and detect a wiring state of the input terminal.

The detection unit 20 may switch between the orders of two of the R phase, S phase, and T phase of the input terminal, and thus rearrange the phase sequence of the three-phase input current so that the phase sequence of the three-phase input current becomes a positive sequence, thereby detecting a wiring state of the input terminal.

For example, when the input terminal is connected to the system 200 in the order of R-T-S corresponding to a negative sequence and thus the phase sequence of the three-phase input current is determined as a negative sequence, the detection unit 20 may switch between the orders of the S phase and T phase of the input terminal to rearrange the phase sequence of the three-phase input current so that a phase sequence becomes the order of R-S-T corresponding to a positive sequence, and compare power factor levels with the phases of the three-phase input current, rearranged in the positive sequence, based on one of the phases of the three-phase voltage to detect a wiring state of the input terminal.

That is, the three-phase wiring detection device 100 may detect the three-phase voltage and the three-phase input current, and determine a phase sequence. When it is determined that the phase sequence of the three-phase input current is a negative sequence, namely, the input terminal is connected to the system 200 in the negative sequence, the three-phase wiring detection device 100 may rearrange the phase sequence of the three-phase input current to a positive sequence, and thus, it is possible to compare a power factor relationship with one of the phases of the three-phase voltage. Therefore, the three-phase wiring detection device 100 may compare a power factor level for each of the phases of the three-phase input current which are rearranged in the positive sequence, based on one of the phases of the three-phase voltage, and determine that a phase in which a level of a power factor is the highest is a phase coincident with a reference phase, thereby detecting a wiring state of the input terminal.

The connection unit 10 may include a potential transformer (PT) 30 and a current transformer (CT) 40. The detection unit 20 may detect the three-phase voltage and the three-phase input current through the PT 30 and the CT 40.

The PT 30 may be disposed on a line connected to the system 200.

The PT 30 may be a voltage transformer for detecting a voltage of the system 200.

The PT 30 may be a voltage transformer for converting a voltage of the system 200, which is a high voltage, into a low voltage capable of being detected.

The PT 30 may be a three-phase transformer for detecting a three-phase voltage of the system 200, or may be a voltage transformer which is configured with three single-phase transformers, and transforms a voltage of each phase.

The CT 40 may be disposed on a line connected to the input terminal of the load 300.

The CT 40 may be a current transformer for detecting a current of the input terminal.

The CT 40 may be a current transformer for converting a current of the input terminal, which is a high current, into a low current capable of being detected.

The CT 40 may be a voltage transformer which is configured with three current transformers for detecting the three-phase input current of the input terminal, and transforms a current of each phase.

The detection unit 20 may detect the three-phase voltage and the three-phase input current through the PT 30, which converts a high voltage of the system 200 into a voltage having a suitable level, and the CT 30 that converts a high current of the input terminal of the load 300 into a current having a suitable level.

The three-phase wiring detection device 100 may further include a display unit 50 that displays a detection result of the detection unit 20.

The detection result may include at least one selected from a detection value of the three-phase voltage, a detection value of the three-phase input current, and a wiring state of the input terminal.

For example, the detection result may include [VR=200 V, 0 degrees], [VS=200 V, 120 degrees], and [VT=200 V, 240 degrees] which are detection values of the three-phase voltage, and include [IR=20 A, 0 degrees], [IS=20 A, 120 degrees], and [IT=20 A, 240 degrees] which are detection values of the three-phase input current.

Moreover, the detection result may include a determination result of a wiring state of the input terminal.

For example, the detection result may include a determination result, in which whether the input terminal is connected to the system 200 in a negative sequence is determined by the zero cross detection technique, and a determination result in which whether the input terminal is connected to the system 200 under a phase discordance condition is determined by comparing a power factor relationship.

The display unit 50 may display the determination result to notify the outside of a defective wiring of the load 300, and allow a rewiring of the input terminal to be made.

The display unit 50 may be a display unit which is provided outside the three-phase wiring detection device 100.

The display unit 50 may be a display unit that displays the detection result on a screen.

The three-phase wiring detection device 100 may display the detection result in the display unit 50 in the form of digitized data or tables.

The three-phase wiring detection device 100 may display, in the display unit 50, a wiring state of the input terminal of the load 300 in a graphical wiring diagram or in the form of drawings.

[Coincidence Phase Detection Method]

A coincidence phase detection method disclosed in the present specification may be implemented by an embodiment of a three-phase wiring detection device and some or a combination of elements or stages included in below-described embodiments, or may be implemented by a combination of embodiments. Technical terms used herein are used for merely describing a specific embodiment, and do not limit the spirit of technology disclosed in the present specification.

Hereinafter, a coincidence phase detection method disclosed in the present specification will be described in detail with reference to FIG. 4.

Figure 4:
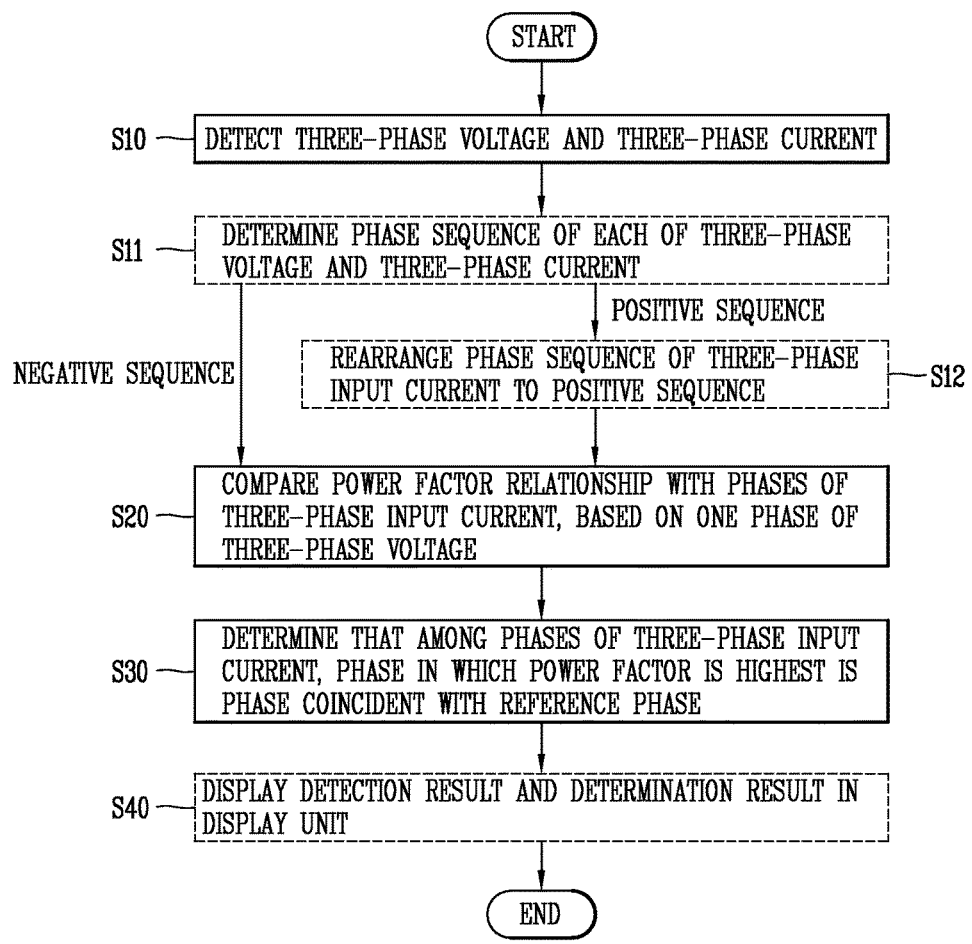
FIG. 4 is a flowchart illustrating a coincidence phase detection method disclosed in the present specification.

FIG. 4 is a flowchart illustrating a coincidence phase detection method disclosed in the present specification.

As illustrated in FIG. 4, the coincidence phase detection method may include an operation (S10) that detects a three-phase voltage of a system and a three-phase input current of an input terminal of a load which is supplied with power from the system, an operation (S20) that compares a power factor relationship with phases of the three-phase input current, based on one phase of the three-phase voltage, and an operation (S30) that determines that among phases of the three-phase input current, a phase in which power factor is the highest is a phase coincident with a reference phase, based on a result of the comparison.

In the system, three phases may be divided into an R phase, an S phase, and a T phase.

The R phase, the S phase, and the T phase may have a phase difference of 120 degrees therebetween.

In the R phase, the S phase, and the T phase, a phase sequence may be provided in the above-described order.

That is, the R phase may be a first phase, the S phase may be a second phase, and the T phase may be a third phase. Therefore, a phase sequence may be provided in the order of R-S-T.

That is, in the system, a phase sequence may be provided in the order of R-S-T.

The system may supply three-phase power, which is generated by the plurality of electricity generation sources, to the load.

The load may be a three-phase apparatus or system which consumes the three-phase power supplied from the system.

The load may be supplied with the three-phase power through the input terminal which is divided into the R phase, the S phase, and the T phase.

That is, the R phase of the input terminal may be connected to the R phase of the system, the S phase of the input terminal may be connected to the S phase of the system, and the T phase of the input terminal may be connected to the T phase of the system. Therefore, the input terminal may be supplied with the power.

When the three-phase power is not supplied to the input terminal which is divided into the R phase, the S phase, and the T phase, the load may not normally operate.

For example, such a case may be a case, in which the input terminal is connected to the system in a negative sequence, or a case in which the input terminal is connected to the system under a phase discordance condition.

A case, in which the input terminal is connected to the system in a negative sequence, may be a case in which the input terminal is connected to the system in the order of R-T-S, the order of T-S-R, and the order of S-R-T where a phase sequence in the order of R-S-T is changed.

That is, a negative sequence may be provided by switching between the orders of two phases in the order of R-S-T.

When the input terminal is connected to the system in a negative sequence, the load may perform a reverse operation.

For example, when the load is the three-phase motor, the R phase of the input terminal may be connected to the T phase of the system, the S phase of the input terminal may be connected to the S phase of the system, and the T phase of the input terminal may be connected to the R phase of the system. That is, when the input terminal is connected to the system in the order of T-S-R which corresponds to a negative sequence with respect to the order of R-S-T, the three-phase motor may reversely rotate according to the order of T-S-R which corresponds to a negative sequence.

A case, in which the input terminal is connected to the system under a phase discordance condition, is a case in which each phase of the input terminal does not match each phase of the system, and may include a case, in which the input terminal is connected to the system in a negative sequence, and a case in which the R phase of the input terminal is connected to one of the S phase and T phase of the system, the S phase of the input terminal is connected to one of the R phase and T phase of the system, and the T phase of the input terminal is connected to one of the R phase and S phase of the system.

For example, the case may include the order of T-S-R, the order of R-T-S, and the order of S-R-T, which corresponds to a case in which the input terminal is connected to the system in a negative sequence. Also, the case may further include a case in which the input terminal is connected to the system in the order of S-T-R or the order of T-R-S.

When the input terminal is connected to the system under the phase discordance condition, a rated voltage and a rated current may not be supplied to the load, or it is difficult to detect the three-phase voltage and the three-phase input current.

That is, the input terminal of the load may be connected to the system so as to match the order of R-S-T corresponding to a phase sequence of the system.

The detecting operation (S10) may include an operation (S11) that determines a phase sequence of each of the three-phase voltage and the three-phase input current. In this case, the phase sequence determining operation (S11) may determine a phase sequence of each of the three-phase voltage and the three-phase input current by using one of the zero cross detection technique and a symmetric coordinate technique.

As an example of determining a phase sequence by using the zero cross detection technique, when the input terminal is connected to the system in the order of R-S-T, the phases of the system may have a phase difference of 120 degrees therebetween. Therefore, a level of a voltage may be 0 at a 0-degree in the R phase of the system, a level of a voltage may be 0 at a 120-degree phase in the S phase of the system, and a level of a voltage may be 0 at a 240-degree in the T phase of the system. Accordingly, when the order in which a level of a voltage is 0 in each of the phases of the system is detected, a phase sequence of the three-phase voltage may be determined, and since the phases of the input terminal have a phase difference of 120 degrees therebetween, when the order in which a level of a current is 0 in each of the phases of the input terminal is detected, a phase sequence of the three-phase input current may be determined.

The symmetric coordinate technique may denote a technique that converts a detection value of a voltage and a detection value of a current for each phase into symmetric coordinates of a zero phase component, a normal phase component, and a reverse phase component, and determines whether a phase sequence is a negative sequence, based on a size of the reverse phase component.

The operation (S11) of determining the phase sequence of the three-phase voltage and the three-phase input current may include an operation (S12) that when a phase sequence of the three-phase input current is a negative sequence, rearranges the phase sequence of the three-phase input current so that the phase sequence of the three-phase input current becomes a positive sequence.

The operation (S12) of rearranging a phase sequence of the three-phase input current may switch between the orders of two of the R phase, S phase, and T phase of the input terminal, and rearrange the phase sequence of the three-phase input current so that the phase sequence of the three-phase input current becomes a positive sequence.

For example, when the input terminal is connected to the system in the order of R-T-S corresponding to a negative sequence and thus the phase sequence of the three-phase input current is determined as a negative sequence, the coincidence phase detection method may switch between the orders of the S phase and T phase of the input terminal to rearrange the phase sequence of the three-phase input current so that a phase sequence becomes the order of R-S-T corresponding to a positive sequence, and compare power factor levels with the phases of the three-phase input current, rearranged in the positive sequence, based on one of the phases of the three-phase voltage to detect a wiring state of the input terminal.

That is, the coincidence phase detection method may detect the three-phase voltage and the three-phase input current, and determine a phase sequence. When it is determined that the phase sequence of the three-phase input current is a negative sequence, namely, the input terminal is connected to the system in the negative sequence, the coincidence phase detection method may rearrange the phase sequence of the three-phase input current to a positive sequence, and thus, it is possible to compare a power factor relationship with one of the phases of the three-phase voltage. Therefore, the coincidence phase detection method may compare a power factor level for each of the phases of the three-phase input current which are rearranged in the positive sequence, based on one of the phases of the three-phase voltage, and determine that a phase in which a level of a power factor is the highest is a phase coincident with a reference phase, thereby detecting a wiring state of the input terminal.

The detecting operation (S10) may detect the three-phase voltage and the three-phase input current through a PT and a CT.

The PT may be disposed on a line connected to the system.

The PT may be a voltage transformer for converting a voltage of the system, which is a high voltage, into a low voltage capable of being detected.

The CT may be disposed on a line connected to the input terminal of the load 300.

The CT may be a current transformer for converting a current of the input terminal, which is a high current, into a low current capable of being detected.

The coincidence phase detection method may repeat the comparing operation (S20) and the determining operation (S30) on phases, instead of the reference phase, among the phases of the three-phase voltage.

That is, when a phase which is a phase coincident with the reference phase among the phases of the three-phase input current is detected, the coincidence phase detection method may repeat the comparing operation (S20) and the determining operation (S30) on the phases instead of the reference phase to detect phases which are phases coincident with the phases instead of the reference phase, thereby detecting all phases which are phases coincident with the phases of the three-phase voltage.

The coincidence phase detection method may further include an operation (S40) that displays a detection result of the detecting operation (S10) and a determination result of the determining operation (S30) in a display unit.

The display unit may be a display unit that displays the detection result and the determination result on a screen.

The detection result may include at least one selected from a detection value of the three-phase voltage, a detection value of the three-phase input current, and a wiring state of the input terminal.

The determination result may include a determination result of a wiring state of the input terminal.

For example, the determination result may include a determination result, in which whether the input terminal is connected to the system in a negative sequence is determined by the zero cross detection technique, and a determination result in which whether the input terminal is connected to the system under a phase discordance condition is determined by comparing a power factor relationship.

The display unit may display the determination result to notify the outside of a defective wiring of the load, and allow a rewiring of the input terminal to be made.

[Detailed Embodiment]

A detailed embodiment disclosed in the present specification may be implemented by an embodiment of a three-phase wiring detection device and an embodiment of a coincidence phase detection method and some or a combination of elements or stages included in below-described embodiments, or may be implemented by a combination of embodiments. Technical terms used herein are used for merely describing a specific embodiment, and do not limit the spirit of technology disclosed in the present specification.

A configuration, an operation, and the principle of the detection device and the coincidence phase detection method are the same as those of the above-described detection device and coincidence phase detection method, and thus, their detailed descriptions are not repeated.

Hereinafter, the three-phase wiring detection device (hereinafter referred to as a detection device) to which the coincidence phase detection method is applied will be described in detail with reference to FIGS. 2 and 4.

The detection device 100 of FIG. 2 includes the connection unit 10, which is connected to the input terminal of the load 300 receiving power from the system 200 that supplies the three-phase power, and the detection unit 20 that detects the three-phase voltage of the system 200 and the three-phase input current of the load 300, compares a power factor relationship with phases of the three-phase input current, based on one phase of the three-phase voltage, and detects a wiring state of the input terminal, based on a result of the comparison. The connection unit 10 may include the PT 30 and the CT 40. The detection device 100 may further include the display unit 50 that displays a detection result of the detection unit 20.

The coincidence phase detection method, as illustrated in FIG. 3, may include: the operation (S10) that detects the three-phase voltage of the system 200 and the three-phase input current of the input terminal of the load 300 which is supplied with power from the system 200; the operation (S11) that determines the phase sequence of the three-phase voltage and the three-phase input current; the operation (S12) that when the phase sequence of the three-phase input current is a negative sequence, rearranges the phase sequence of the three-phase input current so that the phase sequence of the three-phase input current becomes a positive sequence; the operation (S20) that compares a power factor relationship with phases of the three-phase input current, based on one phase of the three-phase voltage; the operation (S30) that determines that among phases of the three-phase input current, a phase in which power factor is the highest is a phase coincident with a reference phase, based on a result of the comparison; and the operation (S40) that displays a detection result of the detecting operation (S10) and a determination result of the determining operation (S30) in the display unit 50. The coincidence phase detection method may repeat the comparing operation (S20) and the determining operation (S30) on phases, instead of the reference phase, among the phases of the three-phase voltage. The coincidence phase detection method may be applied to the detection device 100.

In the operation (S10) that detects the three-phase voltage of the system 200 and the three-phase input current of the input terminal of the load 300 which is supplied with power from the system 200, the detection unit may detect the three-phase voltage and the three-phase input current through the connection unit 10 which is connected to the system 200 and the input terminal of the load 300.

The three-phase voltage and the three-phase input current may be detected through the PT 30 and the CT 40 which are included in the connection unit 10.

In the operation (S11) that determines the phase sequence of the three-phase voltage and the three-phase input current, the detection unit 20 may determine the phase sequence of the three-phase voltage and the three-phase input current by using one of the zero cross detection technique and the symmetric coordinate technique.

In the operation (S12) that when the phase sequence of the three-phase input current is a negative sequence, rearranges the phase sequence of the three-phase input current so that the phase sequence of the three-phase input current becomes a positive sequence, the detection unit 20 switch between the orders of two of the phases of the three-phase input current to rearrange the phase sequence of the three-phase input current so that the phase sequence of the three-phase input current becomes a positive sequence.

The detection unit 20 may determine whether a phase is coincident or not, on the three-phase input current which is rearranged in the positive sequence.

In the operation (S20) that compares a power factor relationship with phases of the three-phase input current on the basis of one phase of the three-phase voltage, the detection unit 20 may compare power factor levels with the phases of the three-phase input current which is rearranged in the positive sequence, based on the reference phase.

In the operation (S30) that determines that among phases of the three-phase input current, a phase in which power factor is the highest is a phase coincident with a reference phase, based on a result of the comparison, the detection unit 20 may determine that among the phases of the three-phase input current which is rearranged in the positive sequence, a phase in which a power factor is the highest is a phase coincident with the reference phase.

That is, it may be determined that among the phases of the three-phase input current which is rearranged in the positive sequence, a phase in which a phase difference with the reference phase is the minimum is a phase coincident with the reference phase, and as the phase difference with the reference phase is reduced, a high power factor may be calculated. Therefore, it may be determined that among the phases of the three-phase input current which is rearranged in the positive sequence, a phase in which a power factor is the highest is a phase coincident with the reference phase.

In the operation (S40) that displays the detection result of the detecting operation (S10) and the determination result of the determining operation (S30) in the display unit 50, the detection unit 20 may display the detection result and the determination result in the display unit 50.

The detection result may include at least one selected from a detection value of the three-phase voltage, a detection value of the three-phase input current, and a wiring state of the input terminal.

The determination result may include a determination result of a wiring state of the input terminal.

The detection device 100 may repeat the comparing operation (S20) and the determining operation (S30) to detect all phases which are phases coincident with phases other than the reference phase.

[Additional Embodiment]

An additional embodiment disclosed in the present specification may be implemented by an embodiment of a three-phase wiring detection device and an embodiment of a coincidence phase detection method and some or a combination of elements or stages included in below-described embodiments, or may be implemented by a combination of embodiments. Technical terms used herein are used for merely describing a specific embodiment, and do not limit the spirit of technology disclosed in the present specification.

A configuration, an operation, and the principle of the detection device and the coincidence phase detection method are the same as those of the above-described detection device and coincidence phase detection method, and thus, their detailed descriptions are not repeated.

Hereinafter, an additional embodiment of each of the three-phase wiring detection device (hereinafter referred to as a detection device) and the coincidence phase detection method will be described in detail with reference to FIG. 5.

Figure 5:
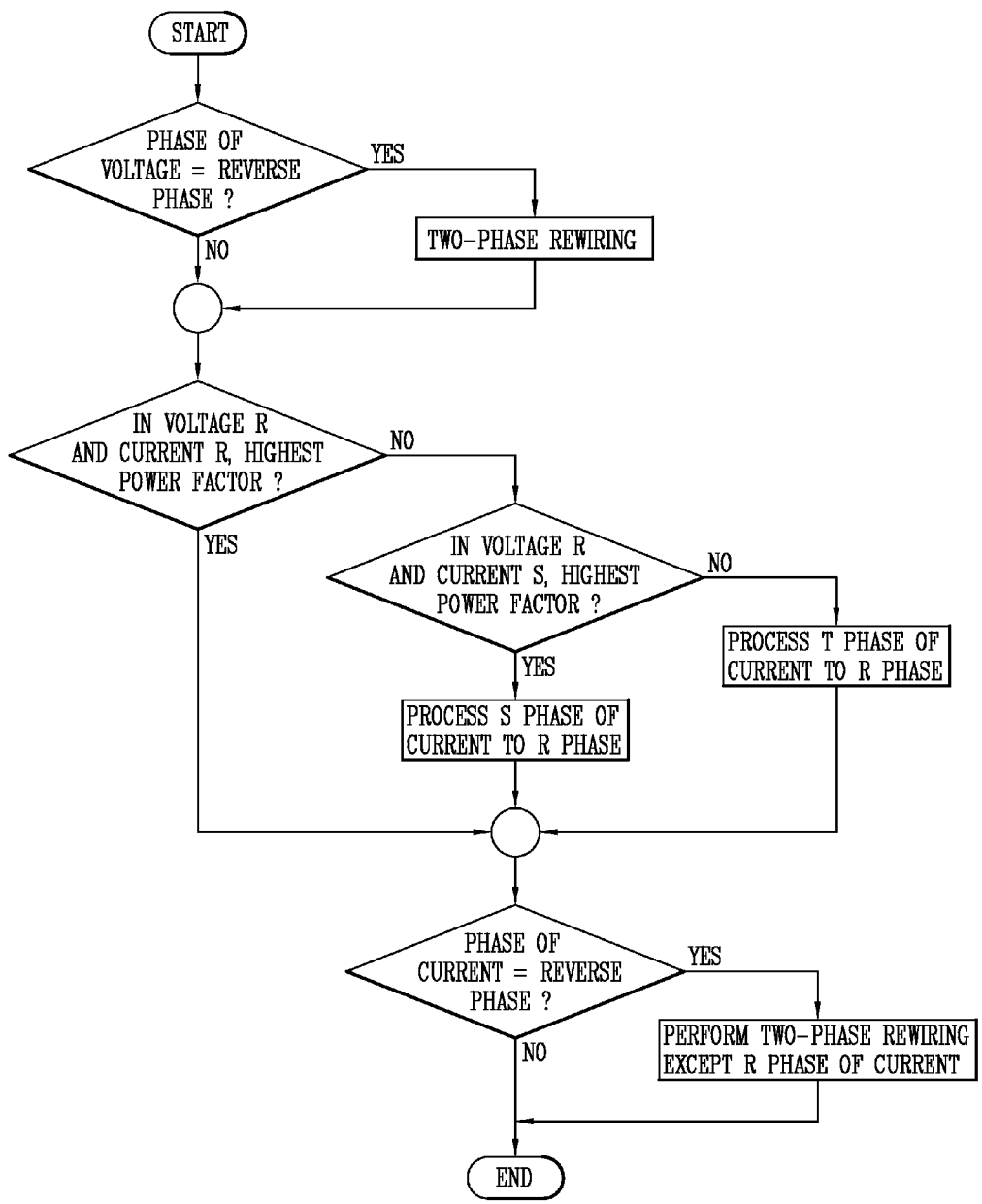
FIG. 5 is a flowchart illustrating an additional embodiment of the three-phase wiring detection device and the coincidence phase detection method disclosed in the present specification.

FIG. 5 is a flowchart illustrating an additional embodiment of the three-phase wiring detection device and the coincidence phase detection method disclosed in the present specification.

The detection device and the coincidence phase detection method may detect a three-phase voltage and a three-phase input current to determine a phase sequence of each of the three-phase voltage and the three-phase input current, and compare power factor levels with phases of the three-phase voltage and phases of the three-phase input current to determine whether a coincidence phase is coincident between the phases of the three-phase voltage and the phases of the three-phase input current.

A detection value obtained by detecting the three-phase voltage, a detection value obtained by detecting the three-phase input current, determination of the phase sequence, and determination of whether the coincidence phase is coincident may be displayed by a display unit included in the detection device, and thus may be shown to a user.

When the detection values and the determinations are displayed by the display unit and are shown to the user, the user may perform a rewiring, based on the detection values and the determinations.

Alternatively, based on the determination of the phase sequence and the determination of whether the coincidence phase, the detection device may correct the detection value so that the detection value, which is obtained through abnormal measurement caused by a negative sequence and a phase discordance wiring, is the same as a detection value which is obtained when a wiring is normally made.

FIG. 5 is a flowchart illustrating an additional embodiment of the three-phase wiring detection device and the coincidence phase detection method disclosed in the present specification.

A process illustrated in FIG. 5 may include <rearrangement of the phase sequence of the three-phase voltage>, <comparing a power factor relationship with the phases of the three-phase input current, based on one phase of the three-phase voltage>, <determining that a phase in which a power factor is the highest is a phase coincident with the reference phase>, and <rearrangement of the phase sequence of the three-phase input current>. The phases of the three-phase voltage and the phases of the three-phase input current may match each other through the process, and thus, a rewiring and correction may be performed.

First, when a phase sequence is a negative sequence as a result of determination of whether a phase sequence of the three-phase voltage is the negative sequence, by switching between the orders of two phases (rewiring and correcting a detection value), the phase sequence of the three-phase voltage may become a positive sequence.

When the phase sequence of the three-phase voltage is the positive sequence, by comparing a power factor relationship with the phases of the three-phase input current based on one phase (an R phase) of the three-phase voltage, it may be determined that a phase, in which a power factor level is the highest, is a phase coincident with a reference phase (the R phase).

As illustrated in FIG. 5, when a power factor level between the reference phase (the R phase) and an R phase of the three-phase input current is the highest, it may be determined that the R phase of the three-phase input current is a phase coincident with the reference phase (the R phase). When a power factor level between the reference phase (the R phase) and the R phase of the three-phase input current is not the highest, whether a power factor level with an S phase of the three-phase input current is the highest may be determined. When it is determined that the power factor level is the highest, it may be determined that the S phase of the three-phase input current is a phase coincident with the reference phase (the R phase) (rewiring and correcting a detection value). When it is determined that the power factor level is not the highest, it may be determined that a T phase of the three-phase input current is a phase coincident with the reference phase (the R phase) (rewiring and correcting the detection value).

When a phase coincident with the reference phase (the R phase) is processed, whether the phase sequence of the three-phase input current is the negative sequence may be determined. When it is determined that the phase sequence of the three-phase input current is the negative sequence, by switching between the orders of two phases other than the phase coincident with the reference phase (the R phase) (rewiring and correcting a detection value), the phase sequence of the three-phase input current may become the positive sequence.

By rewiring and correcting the detection value, the phases of the three-phase voltage and the phases of the three-phase input current match each other, and thus, it is possible to calculate an accurate detection value or perform an accurate coincidence phase accordance wiring between the three-phase voltage and the three-phase input current.

The above-described embodiments of the three-phase wiring detection device and the coincidence phase detection method may be separately implemented, or a combination of one or more embodiments may be implemented.

The above-described embodiments correspond to detailed examples for describing the embodiments of the three-phase wiring detection device and the coincidence phase detection method, and the application and implementation of an embodiment may be made by various types and methods in addition to the above-described embodiments.

The three-phase wiring detection device disclosed in the present specification may be implemented by applying the coincidence phase detection method.

The three-phase wiring detection device disclosed in the present specification may be applied to a three-phase wiring detection device to which the coincidence phase detection method is applied, and may be implemented.

The coincidence phase detection method disclosed in the present specification may be implemented as a program such as an application or an algorithm which detects a three-phase wiring and a coincidence phase.

The three-phase wiring detection device and the coincidence phase detection method disclosed in the present specification may be included in or applied to a data detection device of all three-phase apparatuses and systems and a control device of a three-phase apparatus and system, and may be implemented.

The three-phase wiring detection device and the coincidence phase detection method disclosed in the present specification may be included in or applied to a three-phase watt-hour meter and a three-phase power line communication device, and may be implemented.

The three-phase wiring detection device and the coincidence phase detection method disclosed in the present specification may be included in or applied to an inverter and a controller which control a three-phase motor, and may be implemented.

The three-phase wiring detection device and the coincidence phase detection method disclosed in the present specification enable a user to check whether a coincidence phase is accurately coincident between a three-phase voltage and a three-phase current.

The three-phase wiring detection device and the coincidence phase detection method disclosed in the present specification enable a user to check whether a coincidence phase is accurately coincident between a three-phase voltage and a three-phase current, without adding a separate device. Accordingly, a function of a reverse phase detector and a function of a coincidence phase checker can be implemented.

The three-phase wiring detection device and the coincidence phase detection method disclosed in the present specification enable a user to check whether a coincidence phase is accurately coincident between a three-phase voltage and a three-phase current, and thus, the three-phase voltage and the three-phase current can be accurately detected.

The three-phase wiring detection device and the coincidence phase detection method disclosed in the present specification enable a user to check whether a coincidence phase is accurately coincident between a three-phase voltage and a three-phase current, and thus, a separate process of checking whether the coincidence phase is accurately coincident between the three-phase voltage and the three-phase current is omitted. Accordingly, a time which is expended in installation and wiring of a three-phase apparatus and system can be saved.

The three-phase wiring detection device and the coincidence phase detection method disclosed in the present specification enable a user to check whether a coincidence phase is accurately coincident between a three-phase voltage and a three-phase current, and thus can prevent a defective wiring of a three-phase apparatus and system.

The three-phase wiring detection device and the coincidence phase detection method disclosed in the present specification enable a user to check whether a coincidence phase is accurately coincident between a three-phase voltage and a three-phase current, and thus, an accurate wiring of a three-phase apparatus and system can be made.

The three-phase wiring detection device and the coincidence phase detection method disclosed in the present specification enable a user to check whether a coincidence phase is accurately coincident between a three-phase voltage and a three-phase current, and thus, a three-phase apparatus and system can accurately detect data, and can be accurately, stably controlled.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A three-phase wiring detection device comprising:
a connection unit connected to an input terminal of a load receiving power from a system that supplies three-phase power; and
a detection unit that detects a three-phase voltage of the system, a three-phase input current of the load and a wiring state of the input terminal, wherein the detection unit is configured to:
calculate a power factor of each phase of the three-phase input current based on one of the three-phase voltage;
compare a magnitude relationship of each calculated power factor;

determine whether a coincidence phase of the three-phase voltage is coincident with a coincidence phase of the three-phase current based on the comparison detect the wiring state of the input terminal; and determine a phase among the phases of the three-phase input current in which a power factor is the highest as a phase coincident with the phase of the one of the three-phase voltage based on the comparison.

2. The three-phase wiring detection device of claim 1, wherein the detection unit is further configured to determine a phase sequence of each of the three-phase voltage and the three-phase input current by using a zero cross detection technique or a symmetric coordinate technique.

3. The three-phase wiring detection device of claim 2, wherein the detection unit is further configured to:

determine that a phase sequence of the three-phase input current is a negative sequence; and rearrange the phase sequence of the three-phase input current such that the phase sequence of the three-phase input current becomes a positive sequence and detect the wiring state of the input terminal.

4. The three-phase wiring detection device of claim 1, wherein:

the connection unit comprises a potential transformer (PT) and a current transformer (CT); and the detection unit is further configured to detect the three-phase voltage and the three-phase input current via the PT and the CT.

5. The three-phase wiring detection device of claim 1, further comprising a display unit configured to display a detection result of the detection unit, wherein the detection result comprises at least a detection value of the three-phase voltage, a detection value of the three-phase input current or the wiring state of the input terminal.

\* \* \* \* \*